(12) United States Patent
Urteaga et al.

(10) Patent No.: US 8,679,969 B2
(45) Date of Patent: Mar. 25, 2014

(54) SYSTEM FOR SELF-ALIGNED CONTACTS

(75) Inventors: Miguel Urteaga, Moorpark, CA (US);
Richard L. Pierson, Jr., Thousand Oaks, CA (US); Keisuke Shinohara, Thousand Oaks, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 187 days.

(21) Appl. No.: 13/196,733

(22) Filed: Aug. 2, 2011

(65) Prior Publication Data

US 2013/0032927 A1 Feb. 7, 2013

(51) Int. Cl.
*H01L 21/44* (2006.01)
*H01L 21/02* (2006.01)

(52) U.S. Cl.
USPC ............. 438/652; 257/587; 257/E21.159; 257/E29.173

(58) Field of Classification Search
USPC ........................... 257/354; 438/399
See application file for complete search history.

(56) References Cited

U.S. PATENT DOCUMENTS

| 7,332,775 | B2 | 2/2008 | Steiner et al. |
| 7,563,701 | B2 | 7/2009 | Chang et al. |
| 7,563,713 | B2 | 7/2009 | Rowell et al. |
| 2006/0186543 | A1 * | 8/2006 | Rowell et al. ............ 257/741 |

* cited by examiner

*Primary Examiner* — Fernando L Toledo
*Assistant Examiner* — Valerie N Newton
(74) *Attorney, Agent, or Firm* — Brooks Acordia IP Law, PC

(57) ABSTRACT

A system for forming self-aligned contacts includes electroplating a first metal contact onto a Group III-V semiconductor substrate, the first metal contact having a greater height than width and having a straight sidewall profile, etching back the semiconductor substrate down to a base layer to expose an emitter semiconductor layer under the first metal contact, conformally depositing a dielectric layer on a vertical side of the first metal contact, a vertical side of the emitter semiconductor layer and on the base layer, anisotropically etching the dielectric layer off of the semiconductor substrate to form a dielectric sidewall spacer on the vertical side of the first metal contact and providing a second metal contact immediately adjacent the dielectric sidewall spacer.

7 Claims, 4 Drawing Sheets

SYSTEM FOR SELF-ALIGNED CONTACTS

STATEMENT REGARDING FEDERALLY SPONSORED RESEARCH OR DEVELOPMENT

This invention was made with Government support, promoted by the Defense Advanced Research Projects Agency (DARPA) Microsystems Technology Office (MTO), under contract N6601-02-C-8080 issued by the U.S. Department of the Navy, Space and Naval Warfare Systems Command (SPAWAR) to Teledyne Scientific & Imaging, LLC (then known as Rockwell Scientific Company, LLC). The Government has certain rights in the invention.

BACKGROUND OF THE INVENTION

1. Field of the Invention

The invention relates to semiconductor processing, and more particularly to formation of contacts in compound semiconductor devices.

2. Description of the Related Art

Group III-V semiconductor devices such as diodes, heterojunction bipolar transistors (HBTs) and HEMTs require accurate lithographic registration of outer and inner contacts edges during their fabrication. To maintain good Ohmic contact resistance, registration must be approximately 20% of the contact width. As state-of-the art Group III-V processes are developed that allow sub-200 nm features, such lithographic registration accuracies become more difficult.

A need continues to exist to improve dimension registration of outer and inner contact edges in Group III-V semiconductor devices as their features become smaller.

SUMMARY OF THE INVENTION

A system of forming self-aligned contacts in a Group III-V semiconductor substrates is disclosed. The system includes electroplating a first metal contact onto a Group III-V semiconductor substrate, the first metal contact having a greater height than width and having a straight sidewall profile, etching back the semiconductor substrate down to a base layer to expose an emitter semiconductor layer under the first metal contact; and conformally depositing a dielectric layer on a vertical side of the first metal contact, the emitter semiconductor layer and the semiconductor substrate, anisotropically etching the dielectric off of the semiconductor substrate to form a dielectric sidewall spacer on the vertical side of the first metal contact and providing a second metal contact on the semiconductor substrate.

BRIEF DESCRIPTION OF THE DRAWINGS

The components in the figures are not necessarily to scale, emphasis instead being placed upon illustrating the principals of the invention. Like reference numerals designate corresponding parts throughout the different views.

FIGS. 7 and 8 are cross-sectional views illustrating interim structures made during fabrication of dielectric sidewalls on a first metal contact used to accurately index the near edge of a second metal contact to define a self-aligned second metal contact;

DETAILED DESCRIPTION OF THE PREFERRED EMBODIMENTS

A system is disclosed that allows for the complete (inner and outer edges) self-alignment of one contact with respect to a second contact for use with Group III-V devices such as HBTs, HEMTs and diodes without the need for lithographic registration to define the perimeter of the second contact. FIGS. 1-8 are cross-sectional views illustrating interim structures made during fabrication of a first metal contact having dielectric sidewalls, preferably an emitter contact having dielectric sidewalls, for use in one embodiment of a system to form either self-aligned or doubly self-aligned metal contacts. It is understood that a "doubly self-aligned" contact refers to a second contact that has its near and far edge locations indexed to the nearest edge of a first metal contact, rather than depending on use of lithographic registration to determine the near and far edge locations. A "self-aligned" contact refers to a second metal contact that has only its near edge location indexed to the nearest edge of a first metal contact, rather than depending on use of lithographic registration to determine the near edge location.

Figure 1:
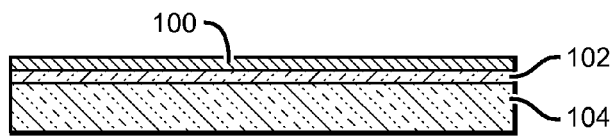
FIGS. 1-8 are cross sectional views illustrating interim structures made during fabrication of a first metal contact having dielectric sidewalls.
Figure 2:
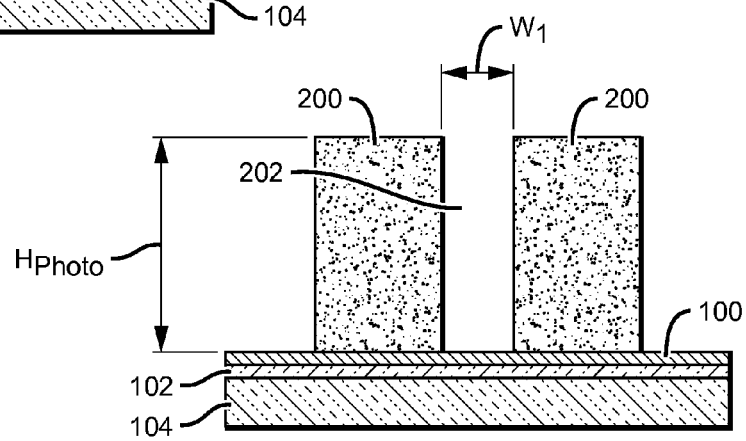
Figure 3:
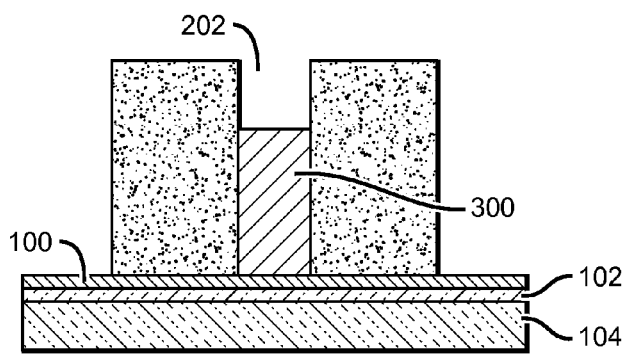
Figure 4:
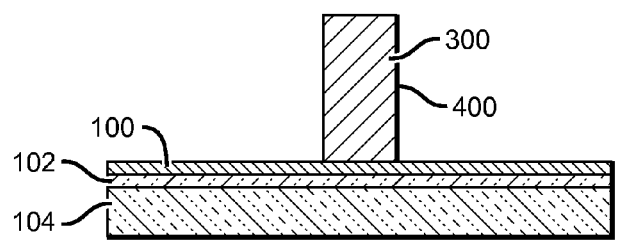

In FIG. 1, an electroplating base 100 is deposited on a first semiconductor layer that is preferably an emitter semiconductor layer 102, by electron beam evaporation or by other sputtering methods. The emitter semiconductor layer 102 is on a base layer 104 of the substrate that is a Group III-V semiconductor substrate. In one embodiment, the electroplating base 100 consists of a titanium (Ti) contacting layer on the emitter semiconductor layer 102, a TiW (a Titanium Tungsten alloy) barrier layer on the Ti contacting layer and a final gold (Au) layer for plating adhesion (not shown). Or, an Au layer may be formed using other seed layers that provide for good adhesion of the electroplating base 100 to the semiconductor layer 102. In FIG. 2, photoresist 200 is preferably spin-coated and patterned on the electroplating base 100 to form an emitter contact opening 202, with the emitter contact opening 202 having a straight side wall profile and with a contact opening height ($H_{Photo}$) greater than its width ($W_1$) to establish a high aspect ratio for the emitter contact opening 202, preferably greater than 2. In FIG. 3, a first metal contact, preferably emitter contact 300 is formed in the emitter contact opening 202, preferably by an electroplating process, to enable a straight sidewall profile for the emitter contact 300. An Au-based plating solution is preferably used for the electroplating process described above, although other metals may be grown for the first metal contact with a suitable change to the electroplating base 100, such as copper (Cu) or aluminum (Al). FIG. 4 illustrates the straight sidewalls 400 of the emitter contact 300 after the photoresist 200 (see FIG. 3) has been stripped down, preferably to the electroplating base 100. In an alternative embodiment, the photoresist 200 is stripped away from the straight sidewalls 400 of the emitter contact 300 and for a distance away from the straight sidewalls 400 to provide spacing for an insulating dielectric layer to be deposited over the emitter contact 300 in future processing steps (see FIG. 7).

Figure 5:
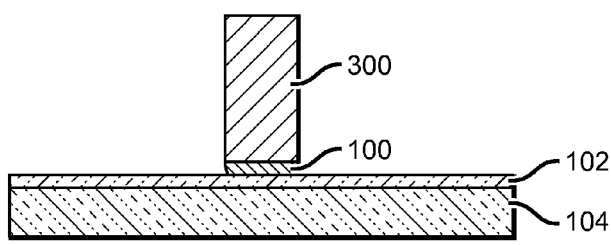
Figure 6:
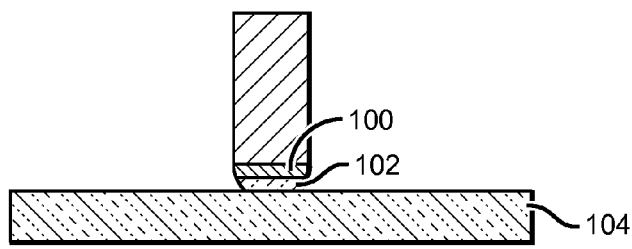

FIG. 5 illustrates the electroplating base 100 substantially removed from the emitter semiconductor layer 102 but for the portion under the emitter contact 300, such as with a reactive ion etching process. If Au, Ti and TiW layers are used for the electroplating base 100 as described above, a wet chemical-based etch may be used to remove first the Au-layer, and a reactive ion etch process may be used to remove the Ti and TiW layers (not shown), although any combination of reactive ion and wet chemical-based etch processes may be used to substantially remove the electroplating base 100. FIG. 6 illustrates the etch continued down through the emitter semiconductor layer 102 and to the base layer 104, preferably using a wet chemical etch process to result in a slight undercut in the plating base 100 and emitter semiconductor layer 102 portions under the first metal contact 300. Or a reactive ion etch process or some combination of both reactive ion etch and wet chemical etch may be used to etch through the emitter semiconductor layer 102.

Figure 7:
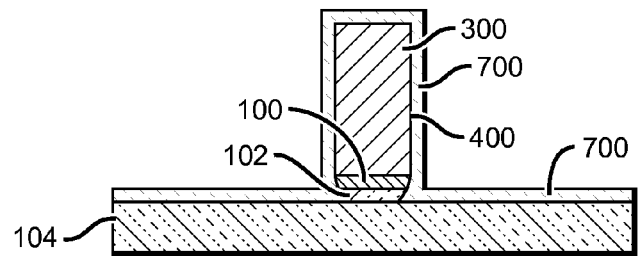
Figure 8:
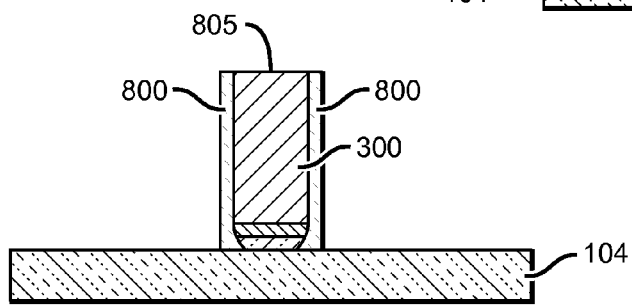

FIGS. 7 and 8 illustrate dielectric sidewalls formed on the emitter contact during its fabrication that provide an indexing width to accurately index the near edge of a second metal contact, such as a base contact. An insulating dielectric layer 700 is conformally deposited on top and side wall portions 400 of the emitter contact 300, as well as on exposed vertical surfaces of the electroplating base 100 and emitter semiconductor layer 102 under the first metal contact 300, preferably using a plasma-enhanced chemical vapor deposition system (PECVD). The insulating dielectric layer 700 is preferably silicon nitride ($Si_xN_y$), or may be formed from a silicon oxide (SiO) film. The insulating dielectric layer 700 and emitter contact 300 are then subjected to an anisotropic etch to form dielectric side wall spacers 800, exposing a top surface 805 of the emitter contact 300 and preferably again exposing the base layer 104.

Figure 9:
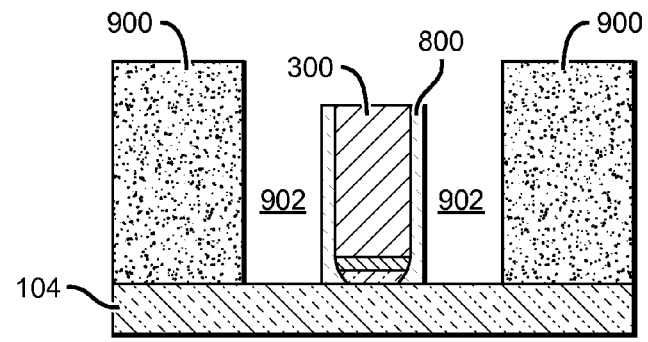
FIGS. 9 and 10 are cross-sectional views illustrating one embodiment of interim structures made to fabricate the self-aligned second metal contact.
Figure 10:
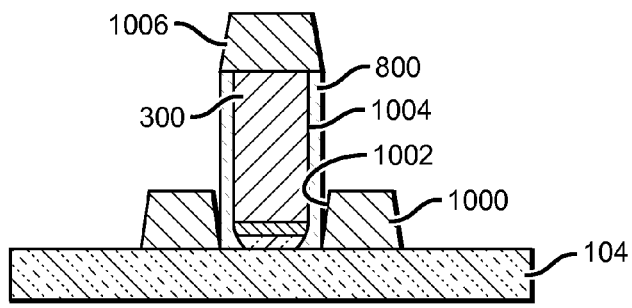

FIGS. 9 and 10 illustrate one embodiment of interim structures made to fabricate a single self-aligned second metal contact, such as a base contact, located adjacent the emitter contact 300 after creation of the emitter contact and its sidewalls illustrated in FIGS. 1-8. In FIG. 9, photoresist 900 is illustrated on the base layer 104 of the substrate with base contact openings 902 created through the photoresist on either side of dielectric side wall spacers 800 of the first emitter contact 300. The photoresist 900 and base contact openings 902 are preferably created through a spin-coating and patterning process. Metal is deposited in the base contact openings 902 to form second metal contacts, preferably base contacts 1000 (see FIG. 10), using an e-beam evaporation process that also deposits a layer of metal 1006 on top of the emitter contact 300 as a byproduct of the process. In a preferred embodiment, the layer of metal 1006 is removed to expose the top surface 805 of the emitter contact 300, however, the layer of metal 1006 need not be removed in one alternative embodiment. The photoresist 900 is then stripped to complete formation of the base contact 1000 that has a near edge 1002 self-aligned with the nearest edge 1004 of the emitter contact 300. The dielectric sidewall spacer insulates the emitter and base contacts (300, 1000) from each other preventing a short circuit. The straight sidewall profile of the emitter and directional nature of the evaporation process prevent base metal coverage on the sidewalls of the emitter that may cause a short circuit.

Figure 11:
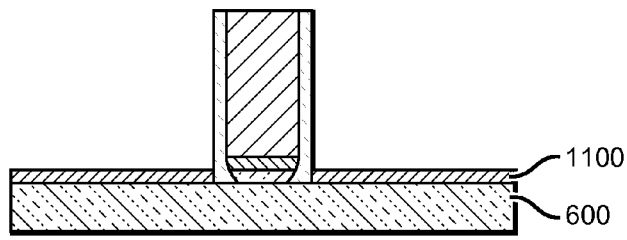
FIGS. 11-17 are cross-sectional views illustrating one embodiment of interim structures made to fabricate a doubly self-aligned second metal contact after creation of the first metal contact and its sidewalls, as first illustrated in FIGS. 1-8.
Figure 12:
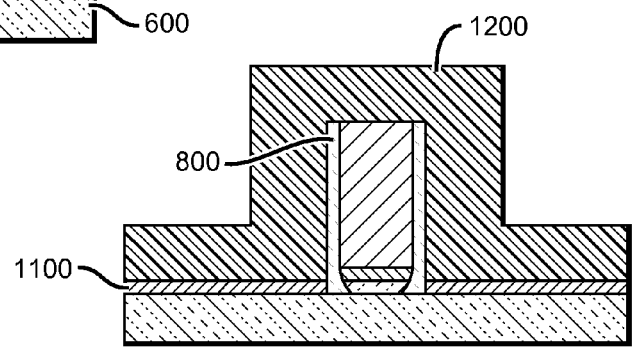
Figure 13:
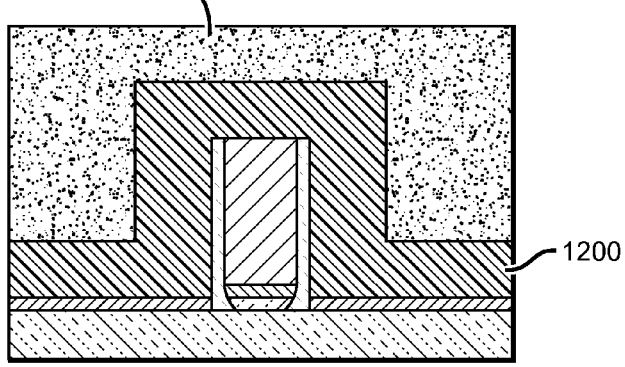
Figure 14:
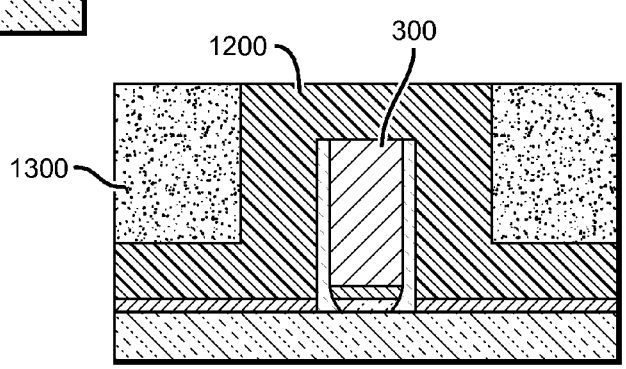
Figure 15:
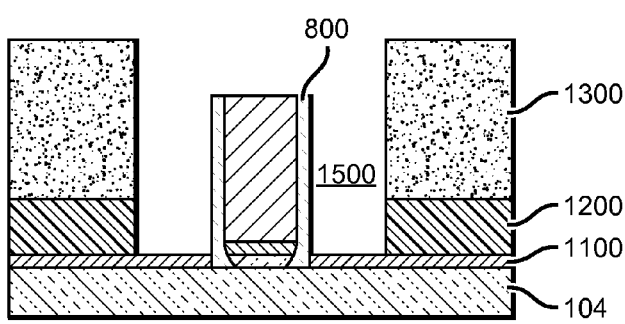
Figure 16:
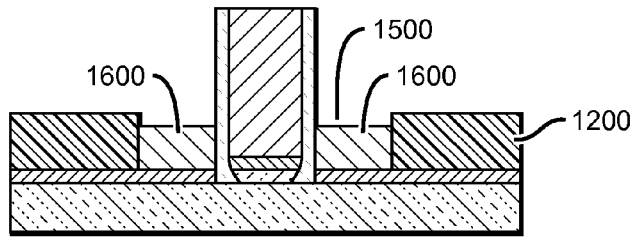
Figure 17:
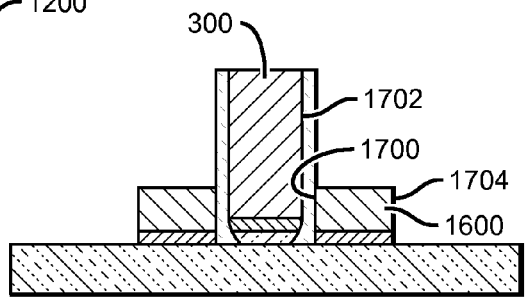

FIGS. 11-17 are cross-sectional views illustrating one embodiment of interim structures made to fabricate a doubly self-aligned second metal contact located adjacent the first contact 300, after creation of the emitter contact 300 and its dielectric sidewalls as illustrated in FIGS. 1-8. Instead of creation of base contact openings 902 in photoresist 900 as illustrated in FIG. 9, FIG. 11 illustrates an alternative first step of a plating base layer 1100 deposited on the base layer 600. The plating base layer 1100 is formed with contacting metal that may be a platinum group metal, titanium, or a refractory metal such as Tungsten, or Molybdenum. The layer may be a combination of these metals to achieve certain characteristics such as low Ohmic contact resistance or good thermal stability. The topmost layer of the plating base may also include a thin Au layer to improve adhesion of an electroplated base contact. Or, in an alternative embodiment, the plating base layer 1100 is omitted. In FIG. 12, a dielectric blanket layer 1200 is illustrated deposited over the dielectric side wall spacers 800 and plating layer 1100 (FIG. 12) using photoresist or a spin-on dielectric such as Benzocyclobutene (BCB). As described above, in one alternative embodiment, the plating base layer 1100 is omitted, and the dielectric blanket layer 1200 may be a reduced-thickness variant of the photoresist 900 first illustrated in FIG. 9, without patterning of the base contact opening 902. In FIG. 13, a planarizing layer 1300 preferably formed of photoresist is formed on the dielectric blanket layer 1200 and the fabrication process continues in FIG. 14 as the planarizing layer 1300 is etched back to expose the top of the dielectric blanket layer 1200 previously formed on the emitter contact 300. With the dielectric blanket layer 1200 now exposed, FIG. 15 illustrates the dielectric blanket layer 1200 after exposure to an etching process that selectively etches the material of the dielectric blanket layer 1200 at a higher rate than the material of the planarization layer 1300 to clear out a portion of the blanket dielectric layer 1200 between the dielectric side wall spacers 800 and planarization layer 1300. The portion of the dielectric blanket layer material 1200 under the planarization layer 1300 is left substantially intact in order to form a second metal contact opening 1500. Etching preferably stops at the plating base layer 1100, or the plating base layer 1100 may be removed in said second metal contact opening 1500 to expose the base layer 104 and a second metal contact seed layer (not shown) provided on the base layer. In FIG. 16, the second contact, preferably base contact 1600, is formed using an electroplating process that selectively deposits metal material in the base contact opening 1500 (See FIG. 15). The planarization material 1300 illustrated in FIG. 15 is stripped to expose the remaining portion of the dielectric blanket layer 1200 illustrated in FIG. 16. In FIG. 17, the dielectric blanket layer 1200 is removed to expose side portions of the base contact 1600 and an upper surface of the base layer 104. Through this fabrication process, the base contact 1600 has a near edge 1700 that is self-aligned with the nearest edge 1702 of the emitter contact 300 and has a far edge 1704 that is also self-aligned with the nearest edge 1702 of the emitter contact 300 to establish a doubly self-aligned base contact 1600.

In one semiconductor device having doubly-self aligned contacts, the various elements of the device would have the approximate thicknesses and widths listed in Table 1.

|  | Height (nm) | Width (nm) |
| --- | --- | --- |
| Electroplating base 100 | 50 | NA |
| Emitter semiconductor layer 102 | 80 | NA |
| Photoresist 200 | 800 | NA |
| First emitter contact 300 | 500-600 | 100 |
| Dielectric side wall spacers 800 | 500-600 | 0.5-1.5 |
| Photoresist 900 | 1000 | NA |

-continued

|  | Height (nm) | Width (nm) |
|---|---|---|
| Second metal contact 1000 | 80 | 100 |
| Dielectric blanket layer 1200 | 200 | NA |
| Planarization layer 1300 | 2000 | NA |

Figure 18:
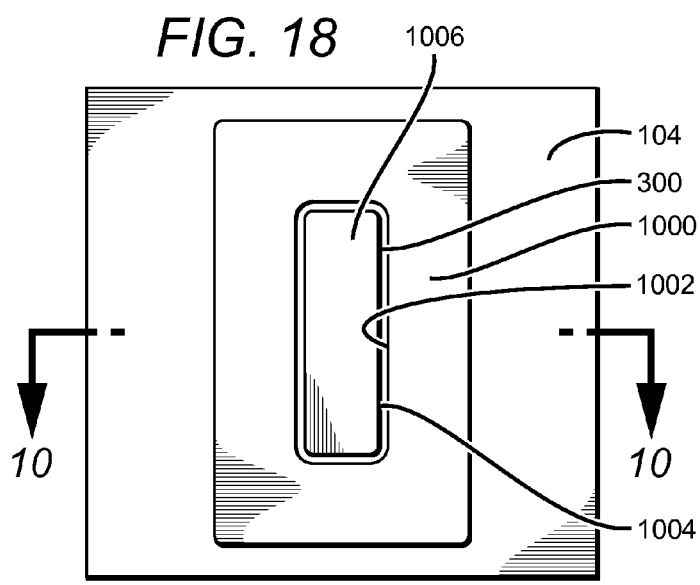
FIG. 18 is an overhead plan view of the first metal contact and self-aligned second metal contact first illustrated in FIGS. 9 and 10.

FIG. 18 is an overhead plan view of the first and second metal contacts first illustrated in FIG. 10. Base contact 1000 is on the base layer 104 and preferably extends around a periphery of the emitter contact 300. As illustrated, the layer of metal 1006 sits atop the emitter contact 300 that is generally rectangular in cross section. The emitter contact 300 is spaced apart from the insulating dielectric layer (covered by the layer of metal 1006). Although illustrated as generally rectangular, the emitter contact 300 may be square or form other cross sections. The near edge 1002 of the base contact 1000 is self-aligned with the nearest edge 1004 of the emitter contact 300 through the fabrication process of the emitter and base contacts (300, 1000).

Figure 19:
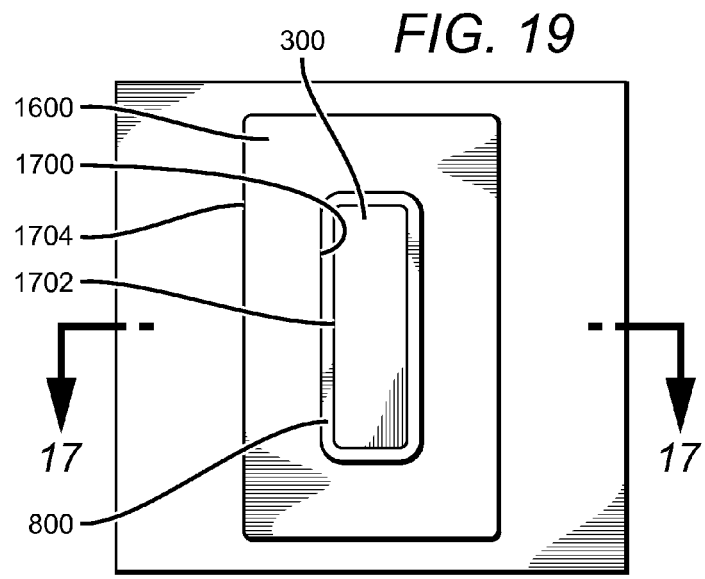
FIG. 19 is an overhead plan view of the first metal contact and doubly self-aligned metal contact illustrated in FIG. 17.

FIG. 19 is an overhead plan view of the first and second metal contacts first illustrated in FIG. 17. The emitter contact 300 is spaced apart from the base contact 1600 by the dielectric side wall spacers 800. The nearest and far edges (1700, 1704) of the base contact 1600 are self-aligned to the nearest edge 1702 of the emitter contact 300 through the fabrication process illustrated in FIGS. 11-17 to establish a doubly self-aligned metal contact. Similar to the emitter contact 300 described for FIG. 18, the emitter contact 300 may be square or form other cross sections.

Although reference is made to an emitter contact and base contacts and structures of a HBT, the contacts and structures may be made to accomplish other semiconductor devices. For example, first and second metal contacts may be used as gate, source and drain contacts for a FET with suitable modification of the semiconductor layers.

We claim:

1. A method of forming doubly self-aligned semiconductor contacts, comprising:
   depositing a first metal contact onto a Group III-V semiconductor substrate;
   depositing a dielectric sidewall spacer on a vertical side of said first metal contact;
   depositing a dielectric blanket layer on a side of said dielectric sidewall spacer opposite from said first metal contact;
   depositing a planarizing layer on said dielectric blanket layer;
   removing a portion of said planarizing layer to expose a portion of said dielectric blanket layer;
   etching said portion of said dielectric blanket layer to form a second contact opening bounded by said dielectric sidewall spacer and said planarizing layer; and
   providing a second metal contact in said second contact opening.

2. The method of claim 1, wherein said providing a second metal contact comprises electroplating a second metal contact.

3. The method of claim 1, further comprising:
   evaporating a base contact on a substrate prior to said depositing said dielectric blanket layer.

4. An apparatus, comprising:
   a first metal contact on a substrate;
   a first dielectric sidewall spacer on vertical sides of said first metal contact;
   a second dielectric sidewall layer on vertical sides of said first dielectric spacer and on said substrate, said second dielectric sidewall layer having a greater etching speed than said first dielectric sidewall spacer; and
   a planarization layer on said second dielectric sidewall layer;
   wherein said second dielectric sidewall layer is configured to etch at a faster rate than said first dielectric sidewall spacer.

5. The apparatus of claim 4, further comprising:
   a base layer formed in said substrate; and
   an emitter layer on said base layer.

6. The apparatus of claim 5, further comprising:
   a plating base layer between said emitter layer and said first metal contact.

7. The apparatus of claim 6, further comprising:
   a plating base layer on said substrate.

* * * * *